US008518230B2

(12) United States Patent
Egli

(10) Patent No.: US 8,518,230 B2
(45) Date of Patent: Aug. 27, 2013

(54) TIN PLATING METHOD

(75) Inventor: André Egli, Richterswil (CH)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 1890 days.

(21) Appl. No.: 11/180,952

(22) Filed: Jul. 13, 2005

(65) Prior Publication Data

US 2005/0249967 A1     Nov. 10, 2005

Related U.S. Application Data

(62) Division of application No. 10/379,926, filed on Mar. 5, 2003, now abandoned.

(60) Provisional application No. 60/361,662, filed on Mar. 5, 2002, provisional application No. 60/408,788, filed on Sep. 6, 2002.

(51) Int. Cl.
    *C25D 3/30* (2006.01)

(52) U.S. Cl.
    USPC ........... 205/300; 205/252; 205/302; 205/303; 205/304

(58) Field of Classification Search
    USPC .................. 205/252, 300, 302, 303, 304
    See application file for complete search history.

(56) References Cited

U.S. PATENT DOCUMENTS

| 4,027,055 A | 5/1977 | Schneble, Jr. |
| 4,053,372 A * | 10/1977 | Davis ............................ 205/253 |
| 4,459,185 A | 7/1984 | Obata et al. |
| 4,749,626 A | 6/1988 | Kadija et al. |
| 4,816,070 A | 3/1989 | Holtzman et al. |
| 4,959,278 A | 9/1990 | Shimauchi et al. |
| 5,750,017 A | 5/1998 | Zhang |
| 6,099,713 A * | 8/2000 | Yanada et al. ............... 205/253 |
| 6,860,981 B2 | 3/2005 | Schetty, III et al. |

FOREIGN PATENT DOCUMENTS

| EP | 0 855 752 | 7/1998 |
| JP | 58-224192 | 12/1983 |

OTHER PUBLICATIONS

Patent Abstract of Japan; JP 2000-173364 A; Jun. 23, 2000.
Patent Abstract of Japan; JP 2003-183796 A; Aug. 9, 1991.
Egli et al.; Where Crystal Planes Meet: Contribution to the Understanding of the Tin Whisker Growth Process; Proceedings of IPC/JEDEC Pb-free Conference, Taipei, Taiwan, Dec. 2002; pp. S08-3-1 (paper and slide show).
U. Lindborg; "A Model for the Spontaneous Growth of Zinc, Cadmium and Tin Whiskers"; Acta Metallurgica (1976); 24(2) pp. 181-186.

(Continued)

*Primary Examiner* — Sikyin Ip
(74) *Attorney, Agent, or Firm* — John J. Piskorski; S. Matthew Cairns

(57) ABSTRACT

A method of reducing tin whisker formation including steps of a) providing a tin or tin-alloy bath containing one or more sources of tin and one or more crystal plane orientation enhancing compounds selected from imides, imines, amides, polyamides, amines, polyamines, polyols, dibutyl thiourea, allyl thiourea, amino thiazole, rhodanine, sulfosalicylic acid and sulfamides; and b) electrodepositing a layer of tin or tin-alloy on a substrate, the tin or tin-alloy layer is free of crystal planes or equivalent planes thereof forming an angle of 5° to 22° with an adjacent crystal plane or an equivalent plane.

12 Claims, 3 Drawing Sheets

(56) References Cited

OTHER PUBLICATIONS

Jordan et al.; "Lead Free Solderable Coatings"; Trans IMF, 2000, 78(6); pp. B82-B88.

Lee et al.; "Spontaneous Growth Mechanism of Tin Whiskers"; Acta Mater., vol. 46, No. 10, 1998, pp. 3701-3714.

Sabbagh et al.; "Tin Whiskers: Causes and Remedies"; Metal Finishing, Mar. 1975; pp. 27-31.

Toben et al.; "Tin Whiskers in Electrodeposits: an overview of the mechanisms that drive their growth"; Proceedings—AESF SUR/FIN Annual International Technical Conference (2001); pp. 176-183.

Tu et al.; Kinetics of Interfacial Reaction in Bimetallic Cu-Sn Thin Films; Acta metal; vol. 30; 1982; pp. 947-952.

K.N. Tu; "Cu/Sn interfacial reactions: thin-film case versus bulk case"; Materials Chemistry and Physics 46 (1996); pp. 217-223.

K.N. Tu; "Interdiffusion and Reaction in Bimetallic Cu-Sn Thin Films"; Acta Metallurgica, vol. 21, Apr. 1973; pp. 347-354.

Jordan et al.; "Lead-Free Solderable Coatings"; Trans IMF, 2000, 78(6); pp. B82-B88.

Lau et al., iNEMI Recommendations on Lead-Free Finishes for Components Used in High-Reliability Products; Version 4 (Jan. 6, 2012); iNEMI International Electronics Manufacturing Initiative; pp. 1-23.

\* cited by examiner

| 200 | 101 | 220 | 211 | 310 | 301 | 002 | 112 | 321 | 420 | 411 | 222 | 312 | 510 | 501 | 431 | 402 | 103 | 332 | 521 | 530 | 213 | 512 | 611 | 323 | 541 | 413 | 532 | 631 | 640 | 701 | |
|---|---|---|---|---|---|---|---|---|---|---|---|---|---|---|---|---|---|---|---|---|---|---|---|---|---|---|---|---|---|---|---|
| 90 | 61.4 | 45.0 | 46.2 | 18.4 | 31.4 | 90 | 75.3 | 42.1 | 26.6 | 27.6 | 64.4 | 51.7 | 11.3 | 20.1 | 41.3 | 42.5 | 79.7 | 57.6 | 28.5 | 31.0 | 70.3 | 37.2 | 19.2 | 62.8 | 41.3 | 54.4 | 42.4 | 30.4 | 33.7 | 14.7 | 200 |
| | 40.0 | 70.2 | 27.4 | 63.0 | 30.0 | 28.6 | 19.8 | 41.1 | 64.6 | 38.6 | 25.6 | 16.0 | 62.0 | 41.3 | 48.6 | 18.9 | 18.3 | 33.9 | 45.3 | 65.7 | 13.0 | 26.7 | 45.1 | 17.7 | 53.0 | 11.2 | 35.4 | 49.9 | 66.5 | 46.7 | 101 |
| | | 40.0 | 42.8 | 26.6 | 52.9 | 90 | 68.9 | 29.1 | 18.4 | 38.4 | 52.3 | 54.2 | 33.7 | 48.4 | 21.6 | 58.6 | 82.7 | 40.8 | 29.5 | 14.0 | 69.1 | 47.5 | 38.8 | 57.5 | 17.2 | 59.0 | 34.8 | 23.8 | 11.3 | 46.8 | 220 |
| | | | 28.3 | 40.0 | 23.0 | 50.7 | 31.2 | 13.7 | 39.4 | 18.7 | 18.2 | 11.4 | 41.7 | 29.8 | 21.2 | 20.2 | 41.6 | 14.2 | 21.0 | 39.5 | 28.5 | 12.6 | 27.0 | 18.0 | 25.6 | 16.2 | 8.02 | 24.0 | 39.9 | 33.9 | 211 |
| | | | | 36.9 | 35.9 | 90 | 71.2 | 30.7 | 8.13 | 24.3 | 56.9 | 49.2 | 7.12 | 27.0 | 27.0 | 45.6 | 80.2 | 47.4 | 19.0 | 12.5 | 68.1 | 36.3 | 19.0 | 58.1 | 18.0 | 53.3 | 34.3 | 17.3 | 15.3 | 23.4 | 310 |
| | | | | | 62.8 | 58.6 | 45.3 | 29.6 | 40.2 | 14.5 | 38.6 | 22.6 | 33.2 | 11.3 | 34.9 | 11.1 | 48.3 | 37.1 | 23.4 | 43.0 | 39.6 | 10.3 | 17.0 | 34.4 | 38.4 | 24.0 | 26.2 | 29.1 | 44.8 | 16.7 | 301 |
| | | | | | | 180 | 21.1 | 63.1 | 90 | 66.0 | 37.7 | 40.8 | 90 | 69.9 | 69.9 | 47.5 | 10.3 | 49.2 | 71.2 | 90 | 22.1 | 54.3 | 73.3 | 33.3 | 36.9 | 36.9 | 57.8 | 7.47 | 90 | 75.3 | 002 |
| | | | | | | | 29.5 | 42.5 | 70.0 | 48.6 | 16.6 | 23.6 | 72.6 | 55.9 | 49.0 | 35.1 | 15.5 | 28.1 | 52.1 | 69.6 | 6.84 | 38.0 | 56.7 | 13.2 | 53.1 | 21.3 | 37.6 | 54.9 | 69.3 | 61.1 | 112 |
| | | | | | | | | 20.1 | 27.8 | 18.0 | 26.8 | 25.2 | 34.5 | 31.5 | 7.41 | 31.5 | 54.7 | 16.7 | 13.6 | 27.1 | 41.2 | 21.0 | 24.6 | 29.8 | 11.9 | 30.0 | 5.72 | 13.4 | 26.9 | 33.7 | 321 |
| | | | | | | | | | 36.9 | 26.9 | 54.6 | 49.7 | 15.3 | 32.9 | 22.5 | 48.7 | 80.8 | 44.1 | 19.4 | 4.40 | 67.9 | 38.4 | 23.8 | 57.0 | 19.9 | 54.1 | 32.4 | 15.3 | 7.12 | 30.1 | 420 |
| | | | | | | | | | | 25.6 | 36.8 | 25.5 | 24.1 | 13.6 | 21.5 | 21.9 | 56.1 | 30.9 | 8.89 | 29.0 | 44.6 | 12.0 | 8.38 | 35.8 | 24.4 | 29.2 | 17.0 | 14.6 | 30.6 | 16.2 | 411 |
| | | | | | | | | | | | 51.2 | 17.0 | 59.4 | 47.3 | 32.8 | 31.4 | 31.1 | 11.5 | 38.1 | 53.6 | 17.9 | 29.0 | 45.2 | 7.88 | 36.7 | 18.6 | 22.6 | 39.8 | 53.2 | 51.8 | 222 |
| | | | | | | | | | | | | 23.8 | 49.8 | 32.6 | 14.4 | 31.2 | 20.4 | 30.5 | 50.4 | 19.1 | 14.5 | 33.3 | 11.8 | 37.1 | 4.79 | 19.5 | 34.6 | 50.9 | 37.7 | 312 |
| | | | | | | | | | | | | | 22.6 | 23.0 | 32.1 | 43.7 | 79.9 | 51.0 | 21.4 | 19.7 | 68.7 | 35.7 | 16.9 | 59.5 | 31.4 | 53.2 | 37.1 | 21.4 | 22.4 | 18.4 | 510 |
| | | | | | | | | | | | | | | 40.3 | 34.5 | 22.4 | 59.6 | 43.3 | 20.6 | 36.4 | 50.6 | 18.5 | 9.58 | 44.3 | 36.9 | 34.7 | 30.1 | 25.7 | 38.6 | 5.46 | 501 |
| | | | | | | | | | | | | | | | 15.3 | 38.2 | 61.8 | 21.8 | 14.3 | 20.9 | 48.2 | 27.3 | 26.2 | 36.7 | 4.49 | 37.4 | 13.1 | 10.9 | 20.4 | 35.5 | 431 |
| | | | | | | | | | | | | | | | | 62.8 | 37.2 | 33.3 | 30.0 | 50.8 | 29.0 | 11.1 | 27.0 | 25.7 | 42.3 | 14.2 | 26.5 | 35.5 | 52.2 | 27.8 | 402 |
| | | | | | | | | | | | | | | | | | 14.6 | 42.4 | 61.7 | 81.2 | 13.7 | 44.2 | 63.1 | 25.3 | 66.1 | 27.0 | 49.2 | 65.6 | 81.4 | 65.0 | 103 |
| | | | | | | | | | | | | | | | | | | 64.7 | 29.6 | 42.8 | 28.8 | 26.8 | 38.9 | 17.5 | 25.5 | 24.2 | 14.2 | 30.1 | 42.1 | 46.9 | 332 |
| | | | | | | | | | | | | | | | | | | | 37.6 | 20.8 | 49.2 | 19.3 | 11.9 | 39.0 | 16.3 | 34.9 | 15.7 | 5.75 | 22.1 | 21.3 | 521 |
| | | | | | | | | | | | | | | | | | | | | 28.1 | 67.9 | 40.1 | 27.0 | 56.8 | 17.7 | 55.0 | 32.2 | 15.9 | 2.73 | 33.9 | 530 |
| | | | | | | | | | | | | | | | | | | | | | 13.7 | 33.3 | 52.3 | 11.6 | 52.5 | 15.9 | 35.8 | 52.6 | 68.0 | 55.9 | 213 |
| | | | | | | | | | | | | | | | | | | | | | | 18.3 | 19.0 | 25.9 | 31.4 | 17.5 | 16.7 | 24.6 | 41.3 | 23.4 | 512 |
| | | | | | | | | | | | | | | | | | | | | | | | 18.1 | 53.1 | 28.0 | 36.5 | 24.8 | 16.5 | 29.2 | 9.35 | 611 |
| | | | | | | | | | | | | | | | | | | | | | | | | 12.3 | 40.9 | 11.8 | 24.7 | 41.8 | 56.7 | 49.2 | 323 |
| | | | | | | | | | | | | | | | | | | | | | | | | | 12.2 | 41.9 | 17.6 | 11.7 | 16.7 | 37.3 | 541 |
| | | | | | | | | | | | | | | | | | | | | | | | | | | 36.0 | 24.3 | 39.1 | 55.6 | 40.0 | 413 |
| | | | | | | | | | | | | | | | | | | | | | | | | | | | 23.7 | 17.3 | 32.3 | 33.2 | 532 |
| | | | | | | | | | | | | | | | | | | | | | | | | | | | | 35.5 | 16.8 | 25.7 | 631 |
| | | | | | | | | | | | | | | | | | | | | | | | | | | | | | 22.6 | 36.4 | 640 |
| | | | | | | | | | | | | | | | | | | | | | | | | | | | | | | 29.3 | 701 |

Fig. 1

TIN PLATING METHOD

CROSS-REFERENCE TO RELATED APPLICATIONS

This application is a Divisional of U.S. application Ser. No. 10/379,926, filed Mar. 5, 2033, now abandoned, which claims the benefit under 35 U.S.C. §119(e) of U.S. Provisional Application Nos. 60/361,662, filed Mar. 5, 2002 and 60/408,788, filed Sep. 6, 2002, the entire contents of which applications are incorporated herein by reference.

BACKGROUND OF THE INVENTION

In general, the present invention relates to the field of tin and tin-alloy plating. In particular, the present invention relates to the reduction of whisker formation in a tin or tin-alloy film.

Tin layers are typically used in the electronics industry to provide good solderability of components. For example, tin layers may be deposited on a copper lead frame to provide a solderable finish. Unfortunately, tin layers, particularly electrodeposited tin layers, are subject to spontaneous whisker formation. "Whiskers" are hair-like single crystals that grow from the surface of the tin layer. Tin whiskers may range in diameter from a few nanometers to several microns (6 nanometers to 6 microns being common) and can reach lengths of several millimeters. Such whiskers can create shorts and introduce noise into electronic circuitry, thus creating a reliability problem in electronic devices.

Conventionally, the use of tin-lead alloys has been provided as a solution to the tin whisker problem. Generally, it is agreed that such alloys are significantly less prone to whisker formation than tin itself. However, the current worldwide activities to ban the use of lead have caused the tin whisker problem to resurface as lead-free tin deposits are increasingly used.

It is believed that tin whiskers form as a result of stresses in the tin or tin-alloy layer, although bulk diffusion of tin is also believed to be involved. However, the precise growth mechanism of tin whiskers is not fully understood. A number of stress-causing factors have been postulated, including lattice stresses due to the presence of impurity atoms in the tin layer, residual stresses due to tin plating conditions, stresses due to mechanical loading or working of the tin layer, stresses due to interaction with adjacent layers, such as intermetallic compound formation, differences in thermal expansion and the like, among others. See, for example, Ewell et al., *Tin Whiskers and Passive Components: A Review of the Concerns*, 18th *Capacitor and Resistor Technology Symposium*, pp 222-228, March, 1998.

Lindborg, in *A Model for the Spontaneous Growth of Zinc, Cadmium and Tin Whiskers, Metallurgica*, vol. 24, pp 181-186, 1976, postulates a two-stage model for whisker formation. The first stage involves diffusion of vacancies away from the place of whisker growth, leading to a counter-flow of tin to the whisker. This is followed by dislocation motion, possibly by grain boundary sliding, as the second stage. Thus, the whisker growth process can be understood as a combination of lattice rearrangements in the tin lattice and a second step where a sub-unit of the tin is not rearranging anymore but breaks out of the bulk deposit representing thereby the beginning of whisker growth. Lee et al. observed that whiskers grow in characteristic angles from the deposit, Lee et al., *Spontaneous Growth mechanism of Tin Whiskers, Acta Mater.*, vol. 46, no. 10, pp 3701-3714, 1998. Lee et al. note that the slip systems in tin are {100} {001} and {100} {010}.

By the combination of these two features, Lee et al. were able to show that whiskers start to grow from grains that have a different crystal growth orientation than the major orientation of the tin film. They explained whisker growth by different elongations of such grains resulting in cracks in the surface oxide layer. In such cases, the tin surface oxide film can be sheared along the boundaries of the grains. Whiskers then grow from the grain whose surface oxide is sheared, in order to release the compressive stress in the tin film. However, this contradicts the observation that tin deposits grow whiskers even when they are stored under high-vacuum conditions where the formation of an oxide layer is prevented. Both of the above-described articles fail to provide a method for overcoming the problem of tin whisker formation.

An approach to reducing tin whisker formation has been to use relatively thick tin layers, for example, layers of about 10 microns thickness. However, such thick layers are not always practical or they may be too thick for certain applications, such as current microelectronic applications.

U.S. Pat. No. 5,750,017 (Zhang) discloses a method of electrodepositing tin or tin alloy onto a metal substrate using pulse plating conditions. Such plating method provides a tin layer typically having a thickness of 3 to 6 microns wherein the grain size of the tin is from 2 to 8 microns. Although such grain size is postulated by Zhang to reduce tin whisker formation, such tin deposits still suffer from tin whisker growth.

There is thus a need for methods of providing tin and tin alloy layers, particularly thin layers, having reduced tin whisker formation and with reduced deposit cracks.

SUMMARY OF THE INVENTION

It has been surprisingly found that tin whisker formation can be greatly reduced by providing a tin or tin-alloy film or layer in which the tin or tin-alloy layer is substantially free of crystal planes or equivalent planes thereof forming an angle of 5° to 22° with an adjacent crystal plane or an equivalent plane thereof. Such a condition increases the tendency to whisker formation.

In one aspect, the present invention provides a method of reducing tin whisker formation that involves electrodepositing a layer of tin or tin-alloy on a substrate, wherein the tin or tin-alloy layer is substantially free of crystal planes or equivalent planes thereof forming an angle of 5° to 22° with an adjacent crystal plane or an equivalent plane thereof.

In another aspect, the present invention provides a tin or tin-alloy layer having reduced whisker formation, wherein the tin or tin-alloy layer is substantially free of crystal planes or equivalent planes thereof forming an angle of 5° to 22° with an adjacent crystal plane or an equivalent plane thereof. Preferably, such tin or tin-alloy layer is electrodeposited.

In a further aspect, the present invention provides an electronic device comprising a tin or tin-alloy layer, wherein the tin or tin-alloy layer is substantially free of crystal planes or equivalent planes thereof forming an angle of 5° to 22° with an adjacent crystal plane or an equivalent plane thereof.

BRIEF DESCRIPTION OF THE DRAWINGS

FIG. 1 is a table showing the smallest possible angle between two individual crystal planes;

DETAILED DESCRIPTION OF THE INVENTION

Figure 2:
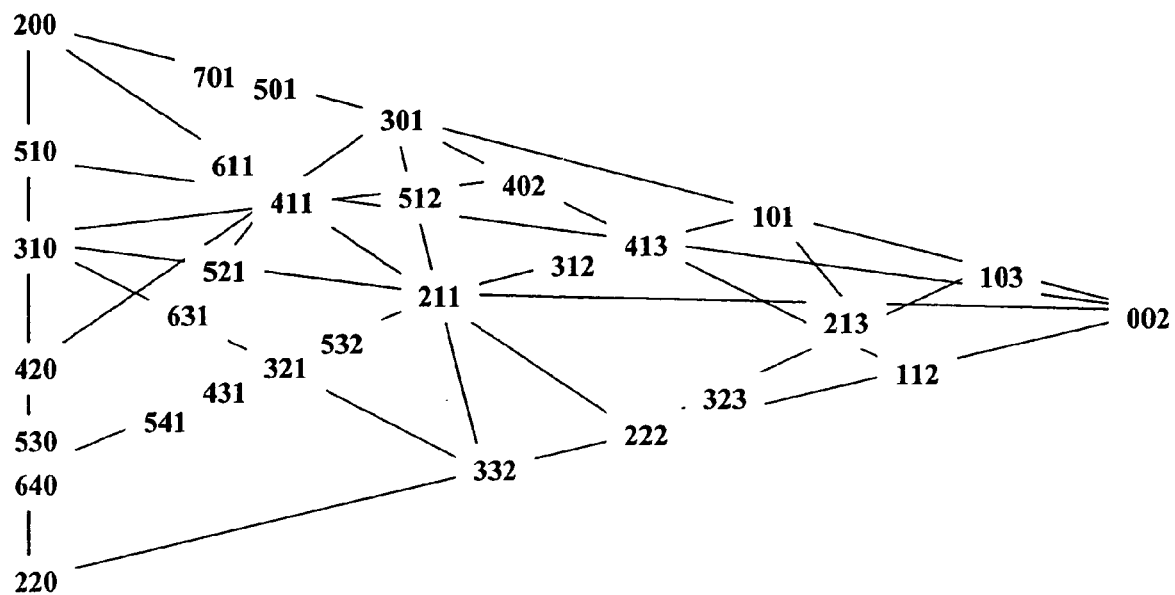
FIG. 2 is a correlation map of all possible crystal planes in a tin layer.

As used throughout this specification, the following abbreviations shall have the following meanings, unless the context clearly indicates otherwise: ° C.=degrees Centigrade; g=gram; L=liter; mL=milliliter; A=amperes; dm=decimeter; and µm=micron=micrometer.

Throughout this specification, the symbols used for Miller indices have their conventional meanings, i.e. "(hkl)" refers to the indices for a crystal plane; "{hkl}" refers to sets of planes that are equivalent; "[hkl]" are the indices of direction in crystals and lattices; and "<hkl>" refers to sets of direction which, by symmetry, are equivalent. The terms "depositing" and "plating" are used interchangeably throughout this specification. "Underplate" and "underlayer" are used interchangeably throughout this specification. The term "underlayer," as used throughout this specification, refers to a layer, preferably a metal layer, disposed between a substrate and a tin or tin-alloy layer. All amounts are percent by weight and all ratios are by weight, unless otherwise noted. All numerical ranges are inclusive and combinable in any order, except where it is obvious that such numerical ranges are constrained to add up to 100%.

As discussed above, whisker growth occurs as a stress release mechanism. From cross-sectional analysis of electroplated deposits, it is known that the grains grow normal to the substrate, forming a fiber texture. If the fibers have a diameter in the range of the deposit thickness, a well polygonized structure is observed. On the other hand, if the diameter is significantly smaller than the deposit thickness, a columnar structure is observed. It has been postulated that such columnar structure of electroplates represents an ideal situation for grain sliding. Accordingly, such grain boundaries are decisive as to whether whiskers grow or not.

Grain boundaries are divided into small- and large-angle grain boundaries. These angles are defined by the crystal planes between two neighboring grains. If the tilt angle between the orientations of two grains is below 15°, the resulting grain boundary is denoted to have a small-angle. Above this value, the grain boundary is denoted to have a large-angle. Diffusion rates depend largely on the grain boundary angle. Diffusion in small-angle grain boundaries approaches the values of volume diffusion, whereas diffusion in large-angle grain boundaries is orders of magnitudes faster. Naturally occurring metals are usually polycrystalline and consist, therefore, in major part of large-angle grain boundaries. The situation is very different with materials that show fibre texture. In an idealized view such a material consists only of 0° angle grain boundaries. It can be assumed that this stage corresponds most likely to a deposit where only one crystal growth orientation is observed. Two things are characteristic for such a deposit: (1) the diffusion rate is very slow, and (2) the diffusion rate throughout the deposit is approximately the same. If, in contrast, the angles in a deposit are large, a fast diffusion along the grain boundaries occurs. It is clear that in the first situation, the deposit is not able to release stress from the bottom, whereas in the latter case the stress will be continuously released immediately after such stress is formed. In addition, the large-angle grain boundary case corresponds to the first stage in the Lindborg model discussed above, where all diffusion processes are based on re-arrangements within the tin lattice, so-called non-conservative dislocation motions. Due to the lack of vacancies in a 0° angle grain boundary deposit, this is not possible and such deposit will therefore be more likely to try to release stress by conservative dislocation motion, where no re-arrangements within the lattice take place. This corresponds to the second stage of the Lindborg model, i.e., grain boundary sliding. However, for whisker growth to occur, both stages are needed. This condition is fulfilled in-between the 0° and the large-angle situation, for example, where the deposit consists mainly of small-angle grain boundaries.

To estimate whether two crystal planes form a small angle between each other, the following formula can be used to calculate the corresponding interplanar angles:

$$\cos\phi = \frac{\frac{(h_1 h_2) + (k_1 k_2)}{a^2} + \frac{(l_1 l_2)}{c^2}}{\sqrt{\left[\left(\frac{h_1^2 + k_1^2}{a^2}\right) + \frac{l_1^2}{c^2}\right]\left[\left(\frac{h_2^2 + k_2^2}{a^2}\right) + \frac{l_2^2}{c^2}\right]}}$$

where $\Phi$ is the angle between two planes, a and c are the cell parameters of the tetragonal β-tin crystal lattice (a=b=5.831 Å, c=3.182 Å, α=β=γ=90°), and $h_1 k_1 l_1$ and $h_2 k_2 l_2$ are the Miller-indices defining the planes in the elementary cell. In this calculation all possible geometrical transformations of a given crystal plane should be considered. This is desired due to the existence of equivalent crystal planes. Such equivalent planes have the same d-line spacing resulting in the same 2Θ. Thus, for a given hkl-plane the tetragonal system allows the following variations: (hkl), (−hkl), (h−kl), (khl), (−khl), (k−hl), (−h−kl), (−k−hl), (hk−l), (−hk−l), (h−k−l), (kh−l), (−kh−l), (k−h−l), (−h−k−l), (−k−h−l). Only small-angle grain boundaries are considered to be of interest for whisker growth. The table in FIG. 1 shows only the smallest possible angle between two individual crystal planes.

Figure 3:
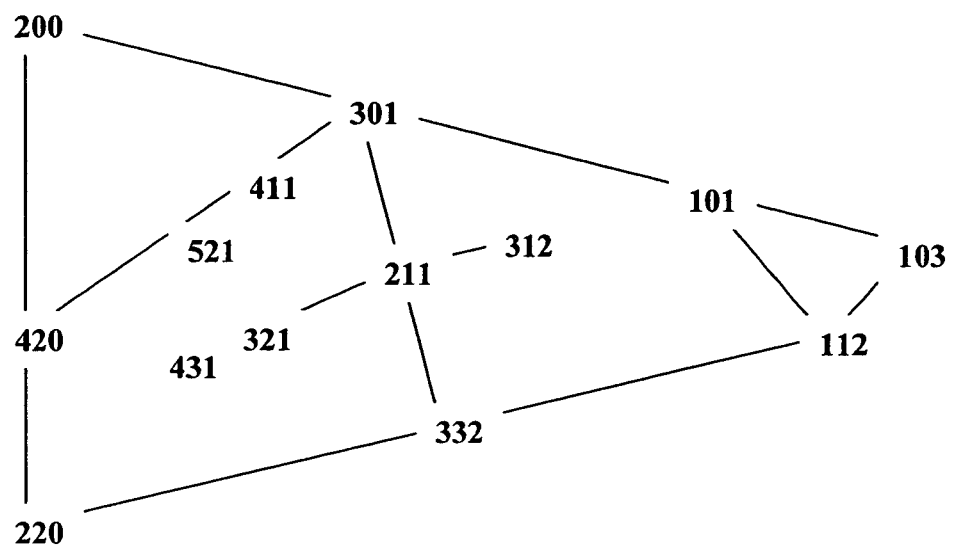
FIG. 3 is a correlation map showing the observable crystal plane orientations within a 2Θ-angle of 20° to 100° from X-ray diffraction.

FIG. 2 is a correlation map of all possible crystal planes in a tin deposit. The correlation map of FIG. 2 was prepared using the data from FIG. 1. However, X-ray diffraction analysis is not able to show all the crystal plane orientations shown in FIG. 2. Therefore, the correlation map must be reduced, for practical reasons, to the observable crystal plane orientations within a 2Θ-angle of 20° to 100°. Such reduced correlation map is shown in FIG. 3.

Tin deposits with two or more adjacent crystal planes in a crystal plane orientation correlation map have the opportunity to form small-angle grain boundaries. An angle likely exists where conservative and non-conservative diffusion processes find an optimum to grow whiskers. Surprisingly, it has been found that grain boundaries having interplanar angles of 5° to 22° have the greatest tendency to form whiskers. As used herein and in the claims, the 5° to 22° angle between adjacent planes also includes angles of 158° to 175° due to the tetragonal symmetry of the tin crystal. Thus, in order to most effectively reduce or eliminate whisker formation, the incidence or intensity of at least one of the planes of the pair of planes forming an angle of 5° to 22° should be below 15%, preferably below 10%, and more preferably below 5% of the total intensities for all observed peaks within an X-ray diffraction spectrum, (Θ-2Θ-scan, 2Θ=20-100°). For example, for (431) and (103) crystal planes, the intensity of each of these is desirably less than 5% of the total intensities for observed peaks. For (321) crystal planes, the intensity of each of these planes is desirably less than 10% of the summarized intensity of all observed peaks within the X-ray diffraction spectrum.

Accordingly, the present invention provides a method of reducing tin whisker formation by depositing a layer of tin or tin-alloy on a substrate, wherein the tin or tin-alloy layer is substantially free of crystal planes or equivalent planes thereof forming an angle of 5° to 22° with an adjacent crystal plane or an equivalent plane thereof, as determined by X-ray diffraction analysis. By "substantially free" it is meant that the intensity of at least one of the crystal planes in each pair forming an angle of 5° to 22° is less than or equal to 15% of the total peak intensities of all observed peaks from the X-ray diffraction analysis, preferably less than or equal to 10%, and more preferably less than or equal to 5%.

The following exemplary combinations correspond to this situation in which two different orientations form an angle between 5° and 22° and therefore will likely lead to tin whisker formation: (220)-(420), (220)-(431), (211)-(312), (211)-(321), (211)-(431), (211)-(411), (211)-(332), (211)-(521), (211)-(301), (301)-(411), (301)-(312), (301)-(521), (321)-(332), (321)-(521), (420)-(431), (420)-(521), (411)-(321), (411)-(431), (411)-(521), (312)-(332), (431)-(332), and (431)-(521). If any these combinations are observed in a tin deposit, the intensity of at least one crystal plane of each pair should not exceed 15% of the summarized peak intensities of all observed peaks, or else whisker formation may occur. The same is also true for crystal planes (101)-(112), (101)-(312), (101)-(103), (112)-(312), and (112)-(103). However, in these latter crystal planes the not detectable (002) plane is assumed to have a non-negligible abundance. Tin deposits that are substantially free of adjacent crystal planes having an angle between them of 5° to 22° may be achieved by selecting conditions and/or tin plating baths to favor a wide range of crystal planes such that the intensities of crystal planes having an angle between them of 5° to 22° are less than 15% of the total peak intensities in the X-ray diffraction spectrum. Such plating conditions include, for example, using direct current plating and pulsed plating, including pulse periodic reverse electroplating. Preferred plating baths include compounds that favor the corners of the crystal plane correlation triangle, i.e., (200), (002), and (220). If at least two different corners are combined, a significantly increased number of observed crystal planes can be achieved, thereby reducing the relative intensity ratio of the individual crystal plane pairs forming an angle of 5° to 22° to an acceptable value.

It is envisioned that such tin deposits may alternatively be achieved using conditions and/or tin electroplating baths that strictly favor one single growth orientation and thereby limit the abundance of, or eliminate, closely related crystal orientations which may form in the critical combinations necessary to promote whisker growth.

The present invention is suitable for reducing whisker formation in pure tin deposits as well as tin-alloys. "Tin-alloys" refer to any metal containing tin and one or more other alloying elements, and thus includes, for example, binary alloys, ternary alloys and the like. Suitable alloying elements include, but are not limited to, bismuth, copper, silver, lead, antimony and zinc, and preferably bismuth, copper and silver. A particularly suitable tin alloy is tin-copper. Such tin-copper alloys may contain, for example, from 0.5 to 10% copper, the balance being tin. Such tin-copper alloys may optionally contain small amounts of other alloying elements. The concentrations of the one or more alloying elements may vary over a wide range. The range of such alloying elements is well within the ability of one skilled in the art. The thickness of the tin or tin-alloy layers may vary across a wide range, depending upon the particular application. For example, when a tin or tin-alloy layer is deposited on a lead frame, it is typically from 1 to 10 microns thick.

The tin or tin-alloy layer may be deposited by a variety of means. Preferably, the tin or tin-alloy is deposited electrolytically. Such electrolytic deposition may be, for example, by direct current ("DC") or pulse plating, including pulse periodic reverse plating. The choice of the deposition technique will depend, for example, upon the particular substrate and the layer to be deposited. Typically, the tin or tin-alloy plating bath is at a temperature of from about 20° to about 60° C., preferably from about 35° to 45° C. Typically, the current density for the tin or tin alloy electroplating is from 1 to 50 amps/dm$^2$, preferably from 5 to 30 A/dm$^2$. Selection of a suitable applied current density can beneficially influence the crystallographic texture.

Suitable electrolytic tin or tin-alloy plating baths may be acidic or alkaline. An exemplary acidic tin electroplating bath contains one or more solution soluble tin compounds, one or more acidic electrolytes, and optionally one or more additives. Suitable tin compounds include, but are not limited to salts, such as tin halides, tin sulfates, tin alkane sulfonate such as tin methane sulfonate, tin aryl sulfonate such as tin phenyl sulfonate, tin phenol sulfonate and tin toluene sulfonate, tin alkanol sulfonate, and the like. It is preferred that the tin compound is tin sulfate, tin chloride, tin alkane sulfonate or tin aryl sulfonate, and more preferably tin sulfate or tin methane sulfonate. The amount of tin compound in these electrolyte compositions is typically an amount that provides a tin content in the range of 5 to 150 g/L, preferably 30 to 80 g/L, and more preferably 40 to 60 g/l. Mixtures of tin compounds may optionally be used in an amount as described above.

Any acidic electrolyte that is solution soluble, is suitable for producing a stable tin electrolyte, and does not otherwise adversely affect the electrolyte composition may be used. Suitable acidic electrolytes include, but are not limited to, alkane sulfonic acids, such as methane sulfonic acid, ethane sulfonic acid and propane sulfonic acid, aryl sulfonic acids, such as phenyl sulfonic acid, phenol sulfonic acid and toluene sulfonic acid, sulfuric acid, sulfamic acid, hydrochloric acid, hydrobromic acid, fluoroboric acid and mixtures thereof. Typically, the amount of acidic electrolyte is in the range of from 10 to 400 g/L, preferably from 50 to 400 g/L, and more preferably from 150 to 300 g/L. It is preferred that when the tin compound is a halide, the acidic electrolyte is the corresponding acid. For example, when tin chloride is used in the present invention, it is preferred that the acidic electrolyte is hydrochloric acid.

In tin-alloy plating baths, one or more alloying metal compound is used in addition to tin. Suitable other metals include, but are not limited to, lead, nickel, copper, bismuth, zinc, silver, antimony, indium and the like. A particularly suitable tin-alloy is tin-copper. The other metal compounds useful in the present invention are any which provide the metal to the electrolyte composition in a soluble form. Thus, the metal compounds include, but are not limited to, salts, such as metal halides, metal sulfates, metal alkane sulfonates, such as metal methane sulfonate, metal aryl sulfonates, such as metal phenyl sulfonate and metal toluene sulfonate, metal alkanol sulfonates, and the like. The choice of the other metal compound(s) and the amount of such other metal compound(s) present in the electrolyte composition depends, for example, upon the tin-alloy to be deposited, and is well known to those skilled in the art.

Optionally, one or more crystal plane orientation enhancing compounds can be used that act in a way to "pull" the crystal plane orientations into a favorable range in which angles of 5° to 22° between crystal planes are minimized. Suitable compounds include, for example, imides, imines, such as carboxymethylated polyethyleneimine, amides, polyamides, amines, such as 3-ethyl amine, polyamines, polycarboxylates, polyols, thiols, such as dibutyl thiourea, allyl thiourea, tetramethyl thiourea, thiourea, amino thiazole, rhodanine, and sulfosalicylic acid, multi-ring compounds containing carbonyl and/or imide functionality, such as rosolic acid, isatin, and carmine, and sulfamides, such as saccharin. The use of such compounds can beneficially maintain the desired crystal structure over a wide range of operating conditions. The one or more crystal plane orientation enhancing compound is typically present in the plating solution in an amount of from 0.05 to 5 g/L.

It will be appreciated by those skilled in the art that one or more other additives may be used in the tin or tin alloy electroplating baths, such as reducing agents, grain refiners such as hydroxy aromatic compounds and other wetting agents, brightening agents, antioxidants, and the like. Mixtures of additives may also be used in the present invention. Such additives are useful, for example, in enhancing the efficiency and/or quality of the plating Reducing agents may be added to the tin and tin-alloy electrolyte compositions to assist in keeping the tin in a soluble, divalent state. Suitable reducing agents include, but are not limited to, hydroquinone and hydroxylated aromatic compounds, such as resorcinol, catechol, and the like. Suitable reducing agents are those disclosed, for example, in U.S. Pat. No. 4,871,429. The amount of such reducing agent is typically from 0.1 g/L to 5 g/L.

Bright deposits may be obtained by adding brighteners to the tin and tin-alloy electrolyte compositions. Such brighteners are well known to those skilled in the art. Suitable brighteners include, but are not limited to, aromatic aldehydes such as naphthaldehyde. benzaldehyde, allylbenzaldehyde, methoxybenzaldehyde and chlorobenzaldehyde, derivatives of aromatic aldehydes, such as benzyl acetone and benzylidine acetone, aliphatic aldehydes, such as acetaldehyde or glutaraldehyde, and acids such as acrylic acid, methacrylic acid and picolinic acid. Typically, brighteners are used at an amount of 0.1 to 3 g/L, and preferably 0.5 to 2 g/L.

Suitable non-ionic surfactants or wetting agents include, but are not limited to, relatively low molecular weight ethylene oxide ("EO") derivatives of aliphatic alcohols containing one or more alkyl group of up to 7 carbons or ethylene oxide derivatives of aromatic alcohols having up to two aromatic rings, which may be fused and which may be substituted with an alkyl group having up to 6 carbons. The aliphatic alcohols may be saturated or unsaturated. The aromatic alcohols typically have up to 20 carbon atoms prior to derivatization with ethylene oxide. Such aliphatic and aromatic alcohols may be further substituted, for example, with sulfate or sulfonate groups. Suitable wetting agents include, but are not limited to, ethoxylated polystyrenated phenol containing 12 moles of EO, ethoxylated butanol containing 5 moles of EO, ethoxylated butanol containing 16 moles of EO, ethoxylated butanol containing 8 moles of EO, ethoxylated octanol containing 12 moles of EO, ethoxylated octylphenol containing 12 moles of EO, ethoxylated/propoxylated butanol, ethylene oxide/propylene oxide block copolymers, ethoxylated beta-naphthol containing 8 or 13 moles of EO, ethoxylated beta-naphthol containing 10 moles of EO, ethoxylated bisphenol A containing 10 moles of EO, ethoxylated bisphenol A containing 13 moles of EO, sulfated ethoxylated bisphenol A containing 30 moles of EO, and ethoxylated bisphenol A containing 8 moles of EO. Typically, such non-ionic surfactants or wetting agents are added in an amount of 0.1 to 50 g/L, and preferably 0.5 to 10 g/L.

It will be appreciated by those skilled in the art that hydroxy aromatic compounds or other wetting agents may be added to these electrolyte compositions to provide further grain refinement. Such grain refiners may be added to further improve deposit appearance and operating current density range. Suitable other wetting agents include, but are not limited to, alkoxylates, such as the polyethoxylated amines JEFFAMINE T-403 or TRITON RW, sulfated alkyl ethoxylates, such as TRITON QS-15, and gelatin or gelatin derivatives. The amounts of such grain refiners useful are well known to those skilled in the art and typically from 0.01 to 20 mL/L, preferably from 0.5 to 8 mL/L, and more preferably from 1 to 5 mL/L. Optionally, an antioxidant compound can be employed in the electrolyte composition to minimize or prevent stannous tin oxidation from occurring, for example, from the divalent to tetravalent state. Suitable antioxidant compounds include, for example, dihydroxybenzene and multivalent compounds based on the elements of groups IV B, V B, and VI B in the Periodic Table of the Elements, such as those of vanadium, niobium, tantalum, titanium, zirconium and tungsten. Typically, such antioxidant compounds are present in the electrolyte composition in an amount of from 0 to 2 g/l.

The optional additives, if any, that are added to the electrolyte compositions will depend upon the results and types of deposits desired.

Whisker formation can be reduced or eliminated when a tin layer is deposited on any substrate, provided that the tin layer is substantially free of crystal planes or equivalent planes thereof forming an angle of 5° to 22° with an adjacent crystal plane or an equivalent plane thereof, as determined from X-ray diffraction analysis. It is preferred that the tin or tin-alloy layer is deposited on a conductive substrate. Particularly suitable substrates include, but are not limited to, copper, nickel, nickel-alloys, cobalt, cobalt-alloys and the like.

The tin layer of the present invention can optionally be deposited on one or more underlayer. Suitable underlayer materials include, but are not limited to, nickel, cobalt and alloys thereof. By "nickel-alloy" is meant any metal containing nickel and one or more different alloying elements, and thus includes binary alloys, ternary alloys and the like. By "cobalt-alloy" is meant any metal containing cobalt and one or more different alloying elements, and thus includes binary alloys, ternary alloys and the like. Suitable alloying elements include, but are not limited to, tungsten, nickel, cobalt, phosphorus, and the like. The amount of nickel in a nickel-alloy and cobalt in a cobalt-alloy varies over a wide range and is well within the ability of one skilled in the art. Particularly suitable underlayers include nickel, cobalt, nickel-cobalt, nickel-phosphorus and nickel-tungsten. Particularly suitable nickel-phosphorus-alloys include those having from 2 to 13% phosphorus.

The minimum thickness of the underlayer is that thickness necessary to provide a substantially continuous metal layer over the substrate surface, such that the tin or tin alloy layer does not intimately contact the substrate surface. A typical minimum thickness of the present underlayer is 0.05 micron. In general, suitable ranges of thickness of the underlayer are from 0.05 to 1 micron, preferably from 0.05 to 0.95 micron, more preferably from 0.1 to 0.75 micron and still more preferably from 0.1 to 0.5 micron.

The underlayer may be deposited by a variety of methods. Suitable methods include, but are not limited to, electroless plating, electrolytic plating, immersion plating or vapor deposition such as physical vapor deposition or chemical vapor deposition. It is preferred that the underlayer is deposited by electroless plating or electrolytic plating, with electrolytic plating being preferred. Such electrolytic deposition may be, for example, by DC or pulse plating. The choice of the deposition technique will depend upon the particular substrate and the layer to be deposited. Such choice is well within the ability of one skilled in the art.

A wide variety of electrolytic nickel baths may be used. Such nickel baths are well known to those skilled in the art and typically contain one or more soluble sources of nickel compounds, such as nickel halides, for example, nickel chloride, nickel sulfate, nickel sulfamate, nickel fluoborate and mixtures thereof. Such nickel compounds are typically employed in concentrations sufficient to provide nickel in the electroplating solutions in concentrations ranging from about 10 to 250 g/L. It is preferred that the nickel electroplating bath contains nickel chloride and nickel sulfamate. It is further preferred that the amount of nickel chloride in the bath is from 8 to 15 g/L and the amount of nickel as nickel sulfamate is from 80 to 150 g/L.

Suitable nickel plating baths typically contain one or more acids, such as boric acid, phosphoric acid, phosphorus acid and mixtures thereof. Exemplary boric acid-containing nickel electroplating baths contain from 30 to 60 g/L of boric acid, and preferably about 45 g/L. Typically, the pH of such baths is from about 3.0 to about 5.0, and preferably is about 4.0. The operating temperature of such nickel electroplating baths may range from about 40° to about 70° C., and is preferably from 50° to 65° C. The average cathode current density typically ranges from about 0.5 to 12 amperes per square decimeter, with 3 to 6 amperes per square decimeter being preferred.

In nickel-alloy plating baths, one or more other alloying metal compound is used with the nickel. Such alloying metal compounds are any which provide the metal to the electrolyte composition in a soluble form. Thus, the metal compounds include, but are not limited to, salts, such as metal halides, metal sulfates, metal alkane sulfonates such as metal methane sulfonate, metal aryl sulfonates, such as metal phenyl sulfonate and metal toluene sulfonate, metal alkanol sulfonates, and the like. The choice of the other metal compound(s) and the amount of such other metal compound(s) present in the electrolyte composition will depend, for example, upon the tin-alloy to be deposited, and is well known to those skilled in the art.

It will be appreciated by those skilled in the art that one or more other additives may be used in the nickel electroplating baths, such as grain refiners, wetting agents, brightening agents and the like. Mixtures of additives may also be used in the present invention. Such additives are useful in enhancing the efficiency and/or quality of the plating.

The present invention also provides a method of depositing a tin or tin-alloy layer on a substrate. The method involves steps of depositing a tin or tin-alloy layer, wherein the tin or tin-alloy layer is substantially free of crystal planes or equivalent planes thereof forming an angle of 5° to 22° with an adjacent crystal plane or an equivalent plane thereof, as determined from X-ray diffraction analysis.

A wide variety of substrates may be used in the present invention. Preferably, the substrate includes one or more metal that forms an intermetallic compound with tin. Suitable substrates include, but are not limited to, copper and alloys thereof, and brass. It is preferred that the substrate includes a copper or copper-alloy layer. Such copper alloys may contain small amounts of one or more other alloying elements.

Thus, the present invention further provides a substrate including a tin or tin-alloy layer wherein the tin or tin-alloy layer is substantially free of crystal planes or equivalent planes thereof forming an angle of 5° to 22° with an adjacent crystal plane or an equivalent plane thereof, as determined from X-ray diffraction analysis.

The present invention is particularly suitable for depositing a tin or tin-alloy layer on an electronic device substrate. Suitable electronic device substrates include, but are not limited to, printed wiring board substrates, lead frames, semiconductor packages, components, connectors, contacts, chip capacitors, chip resistors and the like. Thus, the present invention still further provides an electronic device including a tin or tin-alloy layer wherein the tin or tin-alloy layer is substantially free of crystal planes close together having an angle between them of 5° to 22°, as determined from X-ray diffraction analysis. The present invention is particularly useful for the manufacture of tin and tin-alloy plated lead frames. A particularly suitable tin-alloy for use on such electronic devices is tin-copper, however other tin alloys may also be suitably used.

The present invention allows for whisker formation in tin and tin-alloys to be reduced or even eliminated.

The following examples illustrate methods of reducing tin whisker formation in accordance with the invention, but are not intended to limit the scope of the invention in any aspect.

Example 1

A plating bath is prepared by combining 50 g/L tin as tin(II) methane sulfonate, 160 g/L free methane sulfonic acid, 25 g/L ethoxylated beta-naphthol containing 8 moles EO, and 5 g/L ethoxylated bisphenol A. A copper substrate is electroplated in the bath at a temperature of 40° C. and a current density of 20 A/dm$^2$ using direct current plating. X-ray diffraction analysis is conducted on the plated sample for a 2Θ-angle of 20° to 100° using a Phillips X-ray diffraction instrument.

Example 2

The procedure described in Example 1 is repeated, except using a plating bath prepared by combining 40 g/L tin as tin(II) methane sulfonate, 200 g/L free methane sulfonic acid, 25 g/L ethoxylated beta-naphthol containing 8 moles EO, and 5 g/L ethoxylated bisphenol A.

Example 3

The procedure described in Example 1 is repeated, except using a plating bath prepared by combining 60 g/L tin as tin(II) methane sulfonate, 240 g/L free methane sulfonic acid, 25 g/L ethoxylated beta-naphthol containing 13 moles EO, and 5 g/L ethoxylated bisphenol A.

Example 4

The procedure described in Example 1 is repeated, except using a plating bath prepared by combining 50 g/L tin as tin(II) methane sulfonate, 260 g/L free ethane sulfonic acid, 25 g/L ethoxylated beta-naphthol containing 13 moles EO, and 5 g/L ethoxylated bisphenol A.

Example 5

The procedure described in Example 1 is repeated, except using a plating bath prepared by combining 50 g/L tin as tin(II) phenyl sulfonate, 250 g/L free methane sulfonic acid, 25 g/L ethoxylated beta-naphthol containing 8 moles EO, and 5 g/L ethoxylated bisphenol A.

Example 6

The procedure described in Example 1 is repeated, except using a plating bath prepared by combining 50 g/L tin as tin(II) phenyl sulfonate, 250 g/L free methane sulfonic acid, 25 g/L ethoxylated beta-naphthol containing 8 moles EO, and 5 g/L ethoxylated bisphenol A.

Example 7

The procedure described in Example 1 is repeated, except using a tin plating bath prepared by combining 50 g/L tin as tin(II) methane sulfonate, 160 g/L free methane sulfonic acid, 25 g/L ethoxylated beta-naphthol containing 13 moles EO, 5 g/L ethoxylated bisphenol A, and 5 g/L of a carboxymethylated polyethyleneimine.

Example 8

The procedure described in Example 1 is repeated, except using a tin plating bath prepared by combining 45 g/L tin as tin(II) methane sulfonate, 280 g/L free methane sulfonic acid, 25 g/L ethoxylated beta-naphthol containing 8 moles EO, 5 g/L ethoxylated bisphenol A; 5 g/L of a carboxymethylated polyethyleneimine; and 5 g/L thiourea.

Example 9

The procedure described in Example 1 is repeated, except using a tin plating bath prepared by combining 50 g/L tin as tin(II) methane sulfonate, 160 g/L free methane sulfonic acid, 25 g/L ethoxylated beta-naphthol containing 8 moles EO, 5 g/L ethoxylated bisphenol A, 5 g/L of a carboxymethylated polyethyleneimine, and 1 g/L dihydroxybenzene antioxidant.

Example 10

The procedure described in Example 1 is repeated, except using a tin plating bath prepared by combining 55 g/L tin as tin(II) methane sulfonate, 200 g/L free methane sulfonic acid, 25 g/L ethoxylated beta-naphthol containing 8 moles EO, 5 g/L ethoxylated bisphenol A, 5 g/L of a carboxymethylated polyethyleneimine, and 1 g/L vanadium pentoxide.

Example 11

The procedure described in Example 1 is repeated, except using a tin plating bath prepared by combining 45 g/L tin as tin(II) methane sulfonate, 5 g/l bismuth (III) as bismuth methane sulfonate, 160 g/L free methane sulfonic acid, 25 g/L ethoxylated beta-naphthol containing 8 moles EO, 5 g/L ethoxylated bisphenol A, 5 g/L of a carboxymethylated polyethyleneimine, and 1 g/L vanadium sulfate.

Example 12

The procedure described in Example 1 is repeated, except using a tin plating bath prepared by combining 45 g/L tin as tin(II) methane sulfonate, 1 g/L Cu as copper (II) methane sulfonate, 160 g/L free methane sulfonic acid, 30 g/L polyalkoxylated butanol, and 3 g/L of tetramethyl thiourea.

Example 13

The procedure described in Example 1 is repeated, except using a tin plating bath prepared by combining 45 g/L tin as tin(II) methane sulfonate; 160 g/L free methane sulfonic acid, 30 g/L polyalkoxylated butanol, and 0.05 g/L of rhodanine.

Example 14

The procedure described in Example 1 is repeated, except using a tin plating bath prepared by combining 45 g/L tin as tin(II) methane sulfonate; 160 g/L free methane sulfonic acid, 30 g/L polyalkoxylated butanol, and 3 g/L of sulfosalicylic acid.

Examples 15-28

The same procedures described above in Examples 1-14 are repeated, except a 0.25 micron nickel underlayer is deposited on the copper substrate prior to tin plating. The plating bath contains 120 g/L of nickel sulfomate, 11 g/L of nickel chloride, and 45 g/L boric acid and has a pH of 4.0. The bath temperature is 60° C. and the average cathode current density is 3 A/dm$^2$.

Examples 29-56

The procedures described in Examples 1-28 are repeated, except two substrates for each are electroplated at a temperature of 40° C. and a current density of 20 A/dm$^2$ using pulsed current plating, with an on time of 10 ms and an off time of 40 ms (20% duty cycle) for one substrate and an on time of 5 ms and an off time of 5 ms (50% duty cycle) for the other substrate.

It is expected that the X-ray diffraction data would show that the tin layer in examples 1-56 is substantially free of crystal planes close together having an angle between them of 5° to 22°. It is further expected that the results from the SEM analysis would show that the samples are substantially whisker free.

Examples 57-71

Samples of etched lead frames made from a copper-rich alloy are electroplated with tin to a thickness of 10 µm using the procedures described in Examples 1-14. No barrier layers or undercoats are used.

The lead frames are analyzed for the presence of whiskers by scanning electron microscopy (SEM) after plating. The remaining plated lead frames from each set of samples are stored under controlled conditions in a test chamber at 52° C. and 98% relative humidity. One sample from each Example is removed from the test chamber at one month intervals and analyzed by SEM for the presence of whiskers. It is expected that the results from the SEM analyses would show that the tin layers are substantially whisker free.

What is claimed is:

1. A method of reducing tin whisker formation comprising:
    a) providing a tin or tin-alloy bath comprising one or more sources of tin and one or more crystal plane orientation enhancing compounds selected from the group consisting of imides, imines, amides, polyamides, amines, polyamines, polyols, dibutyl thiourea, allyl thiourea, amino thiazole, rhodanine, sulfosalicylic acid and sulfamides; and
    b) electrodepositing a layer of tin or tin-alloy on a substrate, the tin or tin-alloy layer is substantially free of crystal planes or equivalent planes thereof forming an angle of 5° to 22° with an adjacent crystal plane or an equivalent plane thereof.

2. The method of claim 1 wherein the intensity of each crystal plane and equivalent planes thereof forming an angle of 5° to 22° with an adjacent crystal plane or an equivalent plane thereof is less than or equal to 10% of the summarized peak intensities of all observed peaks in the X-ray diffraction spectrum.

3. The method of claim 2, wherein the intensity is less than or equal to 5% of the summarized peak intensities of all observed peaks in an X-ray diffraction spectrum.

4. The method of claim 1, further comprising the step of applying a current density from 1 to 50 amps/dm$^2$ to the bath to deposit the tin or tin-alloy.

5. The method of claim 4, wherein the current density is from 5 to 30 amps/dm$^2$.

6. The method of claim 1, wherein the tin or tin-alloy bath further comprises one or more of ethylene oxide derivatives of aliphatic alcohols containing one or more alkyl groups of up to 7 carbons and ethylene oxide derivatives of aromatic alcohols having up to two aromatic rings.

7. The method of claim 1, wherein the amount of the crystal plane orientation enhancing compound ranges from 0.05 g/L to 5 g/L.

8. The method of claim 1, wherein the crystal plane orientation enhancing compound is selected from the group consisting of dibutyl thiourea and allyl thiourea.

9. The method of claim 1, wherein an alloying metal is chosen from bismuth, copper, silver, antimony and zinc.

10. The method of claim 9, wherein the alloying metal is selected from the group consisting of bismuth, copper and silver.

11. The method of claim 1, wherein the tin-alloy is tin-copper.

12. The method of claim 11, wherein the tin-copper alloy comprises 0.5% to 10% copper.

\* \* \* \* \*